United States Patent [19]
Kun-Yu et al.

[11] Patent Number: 6,117,755
[45] Date of Patent: Sep. 12, 2000

[54] METHOD FOR PLANARIZING THE INTERFACE OF POLYSILICON AND SILICIDE IN A POLYCIDE STRUCTURE

[75] Inventors: Sung Kun-Yu, Hsinchu; Chien-Hung Chen, Taipei; Yi-Fu Chung, TaiNan; Kuang-Chao Chen, Hsinchu, all of Taiwan

[73] Assignee: Mosel Vitelic Inc., Hsinchu, Taiwan

[21] Appl. No.: 09/121,657

[22] Filed: Jul. 24, 1998

[30] Foreign Application Priority Data

Apr. 21, 1998 [TW] Taiwan ................................. 87106053

[51] Int. Cl.[7] .............................................. H01L 21/3205
[52] U.S. Cl. ........................... 438/592; 438/488; 438/597; 438/654; 438/652
[58] Field of Search ..................... 438/592, 597, 438/488, 654, 655, 656, 657, 652

[56] References Cited

U.S. PATENT DOCUMENTS

| | | | |
|---|---|---|---|
| 4,992,391 | 2/1991 | Wang | 438/257 |
| 5,256,894 | 10/1993 | Shino | 257/388 |
| 5,441,904 | 8/1995 | Kim et al. | 438/592 |
| 5,554,566 | 9/1996 | Lur et al. | 438/655 |
| 5,849,629 | 12/1998 | Stamper et al. | 438/491 |
| 5,877,074 | 3/1999 | Jeng et al. | 438/592 |

*Primary Examiner*—Carl Whitehead, Jr.
*Assistant Examiner*—Khanh Duong
*Attorney, Agent, or Firm*—Bacon & Thomas

[57] ABSTRACT

A method for planarizing the interface of polysilicon and silicide in a polycide structure is presented in this invention. It is by regulating the process temperature when depositing polysilicon to meanwhile improve its planarization. At first, a doped polysilicon layer is deposited on a semiconductor substrate in the integrated circuits, then immediately after the deposition of an undoped polysilicon, the process temperature is reduced and the treatment of purging is followed with, finally, a metal silicide is formed on the undoped polysilcion.

27 Claims, 2 Drawing Sheets

METHOD FOR PLANARIZING THE INTERFACE OF POLYSILICON AND SILICIDE IN A POLYCIDE STRUCTURE

BACKGROUND OF THE INVENTION

1. Field of the Invention

This invention relates to a method for planarizing the interface of polysilicon and, more particularly, to a method of planarizing the surface of polysilicon purge to improve the planarity of the interface of polysilicon by regulating the process temperatures in different stages.

2. Description of the Prior Art

The "single transistor DRAM cell" of a dynamic random access memory (DRAM) is composed of a MOS transistor and a capacitor. As illustrated in FIG. 1, principally, a MOS transistor comprises three electrodes, which are gate 40, source 20 and drain 30 on a semiconductor substrate 10. The conventional MOS transistors are made of metal, silicon dioxide and silicon substrate, but due to the poor adhesion ability of most metal to silicon dioxide, the current manufacturing process prefers to replace metal with polysilicon which has a better adhesion ability. However, polysilicon has a higher resistivity even after doping, so the addition of metal silicide which has a better conductivity will keep good operation state by polycide structure, in which the additional silicide has a comparable thickness with polysilicon. This typical improved gate structure composed of polysilicon and silicide is shown in FIG. 1. The prevalent silicide used in semiconductor manufacturing are tungsten silicide ($WSi_x$), titanium silicide ($TiSi_x$), molybdenum silicide ($MoSi_x$), and cobalt silicide ($CoSi_x$), in which the most favorite one is tungsten silicide ($WSi_x$). In present, the common way to deposit tungsten silicide is by low-pressure chemical vapor deposition (LPCVD) or sputtering.

In the current commercial manufacturing process of integrated circuits, polysilicon is preferably deposited by heating then decomposing silane by the way of LPCVD. And one of the most popular ways is tubular type LPCVD, in which the deposition temperature is controlled between 400° C. and 850° C. and the pressure is between some torrs to 100 torr. Then the steps of nitrogen purging which is used to remove the dangerous reactant gases or inert gas in furnace and vacuuming are followed with.

To reduce the resistivity, performing doping to polysilicon is necessary to transfer it into a good electric conductor. The dopants used can be the elements in group III, such as boron, or which in group V, such as phosphorus. Nevertheless, as the impurity will penetrate into polysilicon during the process of in-situ polysilicon deposition, outgassing of impurity after vacuuming will turn out pollution in furnace and degrade the integrated circuits. Therefore, an additional layer of undoped polysilicon 43 is deposited after the deposition of doped polysilicon 42 to prevent impurity outgassing problem as shown in FIG. 1. The undoped polysilicon layer 43 also can keep from watermark formation in the following wet cleans to improve integration issues.

FIG. 2 depicts the process temperatures in different stages when depositing polysilicon. At first, stage 1 represents the period when a lot of wafers are loaded into the furnace, then in stage 2 temperature is raised from the standby temperature $T_1$ to a preferred polysilicon deposition temperature $T_2$. After that, polysilicon is deposited and doped at the temperature of $T_2$, represented in stage 3, and when the desired thickness of polysilicon has been obtained, the dopant source is turned off. Next, a thin undoped polysilicon film 43 is deposited over the doped polysilicon 42 in stage 4. Then stop depositing and perform purging and de-vacuuming, in stage 5A. In stage 6A, temperature is slowly going down to standby temperature $T_1$ just after stage 5A. Finally in stage 7, the wafers are unloaded from the furnace, thus the deposition of polysilicon is altogether completed.

However, according to the prior art, the undoped polysilicon 43 still stays in high temperature for a little while after being well deposited, as represented in stage 5A. During the process of purging and de-vacuuming with a high temperature, the layer 43 will receive the heat from the furnace and start to crystallize which is just like under an annealing process. So that a rough and uneven surface of polysilicon layer 43 is caused by the movement and recrystallization of silicon atoms on surface. Further, the peeling of tungsten silicide 44 which is subsequently deposited will be occurred due to its poor adhesion to the rough surface of polysilicon layer 43. Thus, the problem in electric property and reliability of products are unavoidable. To solve this issue and enhance the yield, a method for planarizing the surface of polysilicon is provided in the present invention to form an undoped polysilicon layer with a smooth surface by regulating the process temperatures.

SUMMARY OF THE INVENTION

It is therefore the primary object of this invention to provide a method for smoothening the interface of polysilicon and silicide in a policide structure to improve the peeling of silicide resulted from its poor adhesion ability to a rough interface.

It is therefore another object of this invention to improve the problems from the rough interface of polysilicon and silicide by planarizing the surface of polysilicon meanwhile with the deposition of polysilicon by temperature regulating.

The above mentioned objects are achieved by the following steps. At first, a doped polysilicon is deposited on the gate oxide of a gate structure by tubular LPCVD, in which the dopant is in-situ doped. After turning off the dopant source, an undoped polysiliocn is deposited on the doped polysilicon. Then reduce the tubular temperature to the standby one and perform the steps of purging and vacuuming.

The key point of this invention is that the tubular temperature is lowered immediately after finishing depositing polysilicon and just before starting to purge. This way, the problem due to a rough and uneven surface of polysilicon resulted from purging in high temperature can be effectively amended.

DETAILED DESCRIPTION OF THE EMBODIMENT

A method for planarizing the interface of polysilicon and silicide is provided in the current invention, in which polysilicon and silicide are working together as the conducting layer in the integrated circuits. And the gate structure of a MOS transistor is presented especially as an embodiment in the following description to reveal this method.

Figure 3:
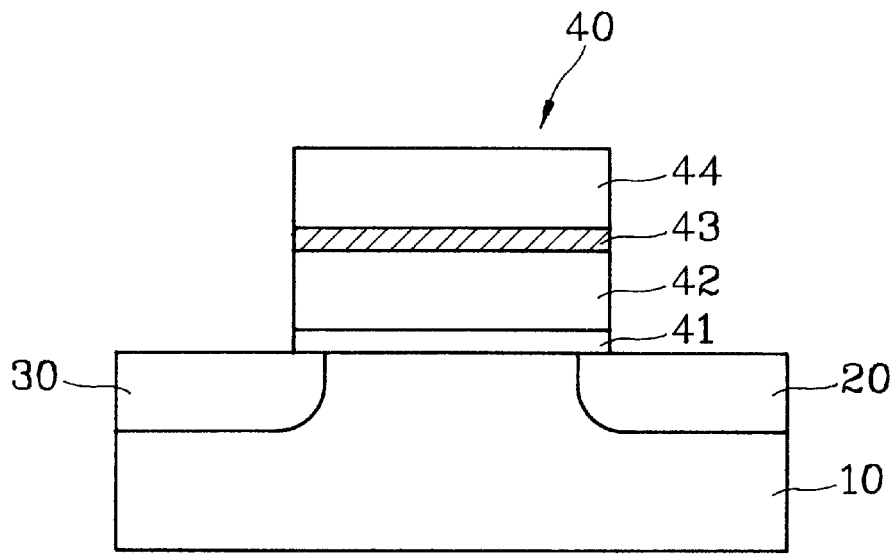
FIG. 3 is a cross-section view of the polycide structure according to the present invention.
Figure 4:
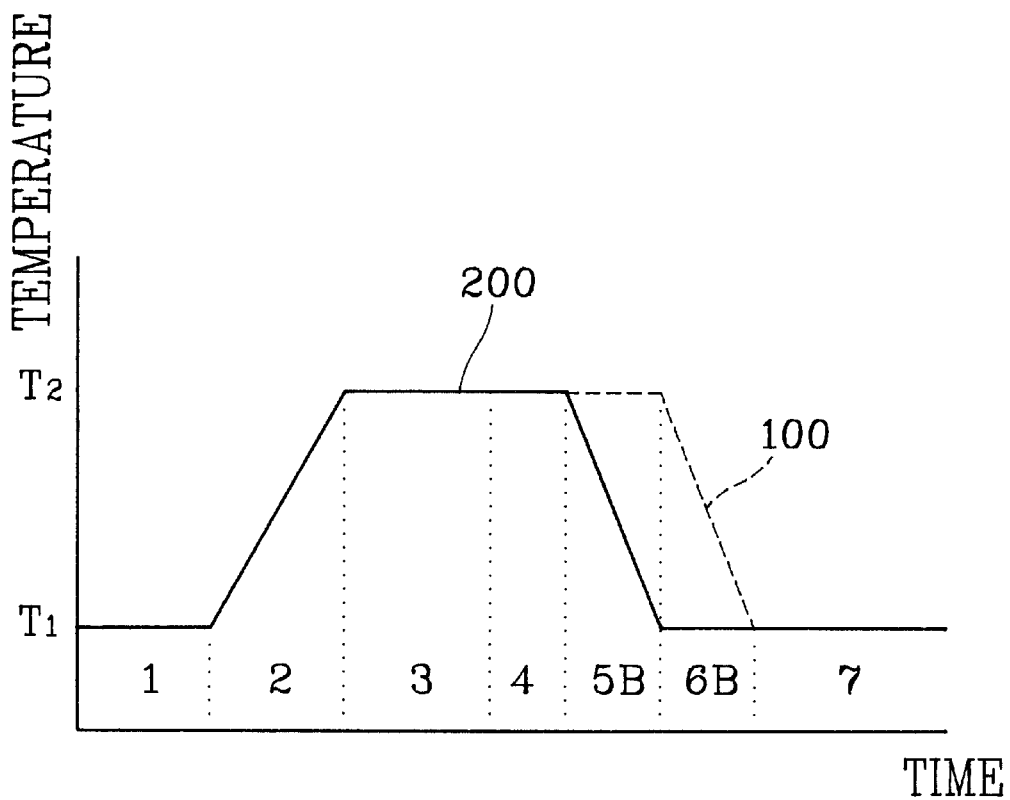
FIG. 4 is a temperature chart in different stages according to the present invention.

Please refer to FIG. 3 as a cross-section view of a gate structure and FIG. 4 as a temperature chart in different stages according to the present invention when depositing a polycide structure. Primarily, a semiconductor substrate 10 on which the gate structure 40 of a MOS transistor is well developed is provided. And a polysilicon layer is subsequently deposited by tubular type LPCVD on the gate oxide 41, which has already been formed in the gate structure 40. The stage 1 in FIG. 4 signifies the period when a lot of wafers are loaded into the furnace, and in stage 2 the temperature is risen from the standby temperature $T_1$ (about 400° C.) to the deposition temperature of polysilicon $T_2$ (about ranging form 560° C. to 650° C.). Then at the temperature $T_2$, a polysilicon layer 42 is deposited and doped in stage 3, in which the dopant is either boron or phosphorus. When the desired thickness of the doped polysilicon 42 which is about 1000 angstroms to 2000 angstroms has been obtained, turn off the doping source. Next, an undoped polysilicon 43 is deposited on the doped polysilicon 42 in stage 4, yet the thickness of the undoped polysilicon 43 is depending on what is and how much the dopant in the doped polysilicon 42. Preferably, a layer of undoped polysilicon 43 with a thickness of about 100 angstroms to 500 angstroms is used.

Figure 1:
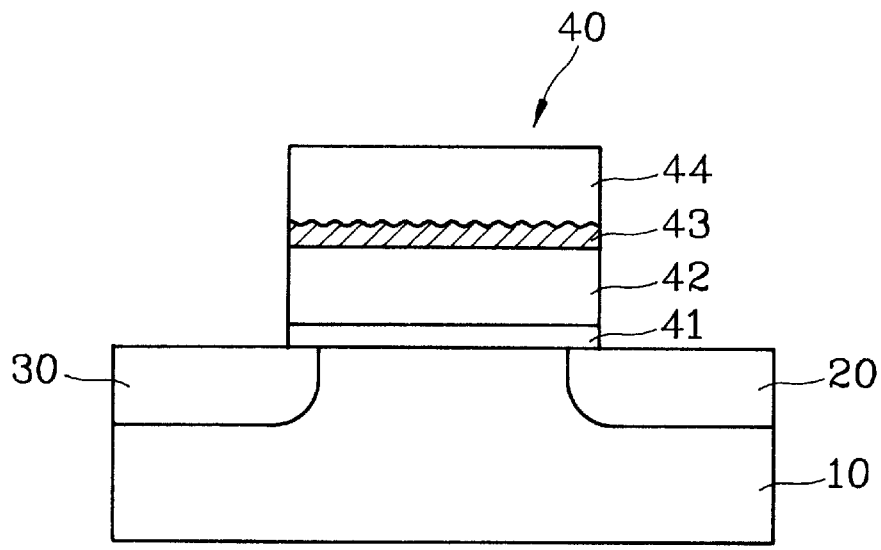
FIG. 1 is a cross-section view of the gate structure according the prior art.
Figure 2:
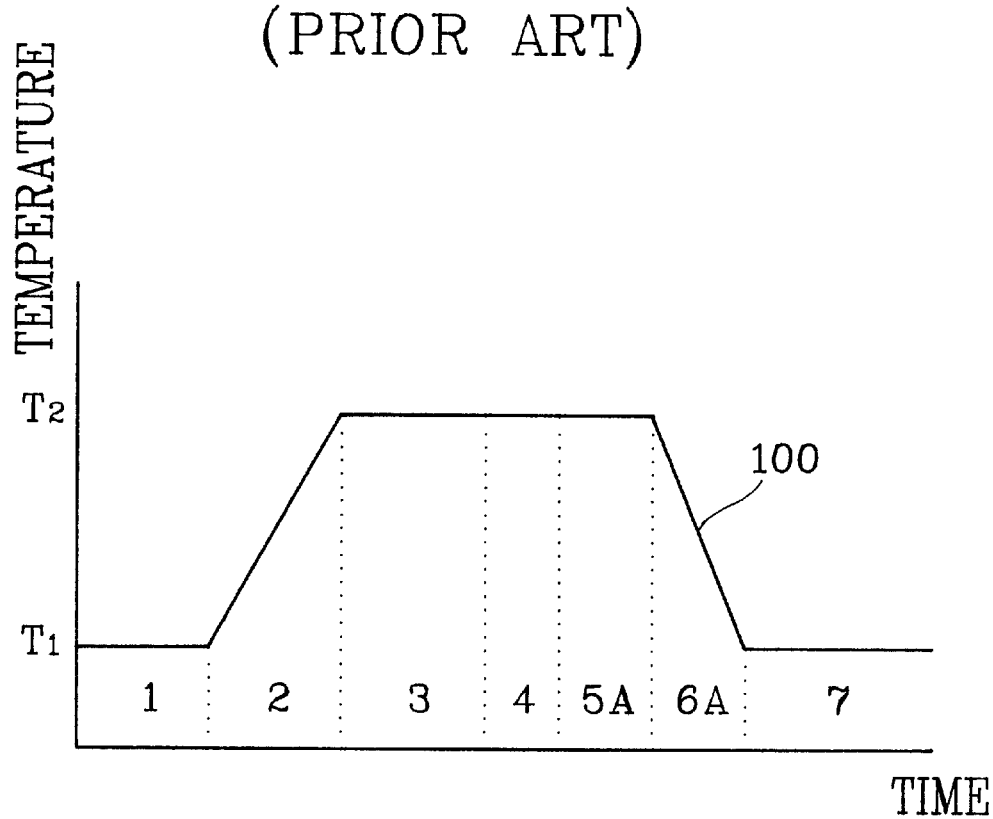
FIG. 2 is a temperature chart in different stages according to the prior art.

The subsequent step is the key point of this invention. Unlike the high temperature purging in the prior art, as shown in FIG. 2, it's right before starting to purge and de-vacuum, the process temperature has been reduced to the standby temperature $T_1$ (stage 5B). Therefore, the step of purging is taking place under a low temperature in stage 6B. Then the wafers are unloaded from furnace in stage 7, until now, the deposition of polysilicon is well done.

Subsequently, a layer of metal silicide 44 is deposited on the undoped polysilicon 43 by LPCVD, in which tungsten silicide ($WSi_x$) is chosen as the material for silicide. Finally, the polycide of a MOS transistor is defined through lithography and dry etching, as illustrated in FIG. 3.

One of the reason causing a rough surface to an undoped polysilicon layer is that the atoms of polysilicon on surface will move and recrystallize when undergoing annealing in high temperature, so the problems in electric property and reliability of products are resulted and the yield will be astonishingly degraded. Therefore, in the current invention, the temperature is made down immediately after finishing depositing the undoped polysilicon, and the following steps, such as purging, are all performed in a lower standby temperature. This way, the movement and recrystallization of the atoms on polysilicon surface can be greatly suppressed and the uniformity of polysilicon surface will meanwhile be effectively improved. Furthermore, planarization in this invention is completed meanwhile with the deposition of polysilicon, so any other subsequent steps for planarization are not necessary, thus an increasing cost will not be a concern.

The method for planarizing the interface of polysilicon and silicide in a polycide structure presented in this invention has the following advantages:

1. This method can prevent the peeling of silicide which is resulted from its poor adhesion to a rough surface of polysilicon.

2. This method is able to keep the polysilicon surface smooth by reducing the temperature first. And during the period of purging and de-vacuuming, the silicon atoms of the surface will not re-crystallize so there is no need at all to take any additional step in the subsequent process to deal with this problem.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for planarizing the interface of polysilicon and silicide in a polycide structure on a furnace, comprising the steps of:

(a) forming a doped polysilicon layer on a substrate at a first temperature in integrated circuits;

(b) forming an undoped polysilicon layer over said doped polysilicon layer at a second temperature;

(c) performing purge and vacuuming said furnace at a third temperature, wherein said third temperature is lower than said first and second temperatures; and (d) forming a silicide layer over said undoped polysilicon layer.

2. The method according to claim 1, wherein said doped polysilicon layer is formed by low-pressure chemical vapor deposition (LPCVD).

3. The method according to claim 2, wherein said LPCVD is performed by a batch type tubular LPCVD system.

4. The method according to claim 1, wherein said first temperature is ranging from 560° C. to 650° C.

5. The method according to claim 1, wherein said doped polysilicon layer is doped boron or phosphorus ions.

6. The method according to claim 1, wherein said undoped polysilicon layer is formed by low-pressure chemical vapor deposition (LPCVD).

7. The method according to claim 6, wherein said LPCVD is performed by a batch type tubular LPCVD system.

8. The method according to claim 1, wherein said second temperature is ranging from 560° C. to 650° C.

9. The method according to claim 1, wherein said third temperature is about 400° C.

10. The method according to claim 1, wherein said third temperature is below 500° C.

11. The method according to claim 1, wherein said doped polysilicon layer has a thickness of between 1000 angstroms to 2000 angstroms.

12. The method according to claim 1, wherein said undoped polysilicon layer has a thickness of between 100 angstroms to 500 angstroms.

13. The method according to claim 1, wherein said silicide is tungsten silicide ($WSi_x$).

14. A method for planarizing the interface of polysilicon and silicide in a polycide structure on a furnace, comprising the steps of:

(a) forming a doped polysilicon layer on a substrate at a first temperature in integrated circuits;

(b) forming an undoped polysilicon layer over said doped polysilicon layer at a second temperature;

(c) performing purge and vacuuming said furnace at a third temperature, wherein said third temperature is lower than said first and second temperatures; and (d) forming a silicide layer over said undoped polysilicon layer; and (e) etching said silicide layer, undoped polysilicon layer and doped polysilicon layer to define said polycide structure.

15. The method according to claim 14, wherein said doped polysilicon is formed by low-pressure chemical vapor deposition (LPCVD).

16. The method according to claim 15, wherein said LPCVD is performed by a batch type tubular LPCVD system.

17. The method according to claim 14, wherein said first temperature is ranging from 560° C. to 650° C.

18. The method according to claim 14, wherein said doped polysilicon layer is doped boron or phosphorus ions.

19. The method according to claim 14, wherein said undoped polysilicon layer is formed by low-pressure chemical vapor deposition (LPCVD).

20. The method according to claim 19, wherein said LPCVD is performed by a batch type tubular LPCVD system.

21. The method according to claim 14, wherein said second temperature is ranging from 560° C. to 650° C.

22. The method according to claim 14, wherein said third temperature is about 400° C.

23. The method according to claim 14, wherein said third temperature is below 500° C.

24. The method according to claim 14, wherein said doped polysilicon layer has a thickness of between 1000 angstroms to 2000 angstroms.

25. The method according to claim 14, wherein said undoped polysilicon layer has a thickness of between 100 angstroms to 500 angstroms.

26. The method according to claim 14, wherein said silicide is tungsten silicide ($WSi_x$).

27. The method according to claim 14, wherein said etching is anisotropic dry etching.

* * * * *